(12) United States Patent
Mills

(10) Patent No.: US 11,066,180 B2
(45) Date of Patent: Jul. 20, 2021

(54) REFUELLING SYSTEM

(71) Applicant: AIRBUS OPERATIONS LIMITED, Bristol (GB)

(72) Inventor: Richard Mills, Bristol (GB)

(73) Assignee: AIRBUS OPERATIONS LIMITED, Bristol (GB)

(*) Notice: Subject to any disclaimer, the term of this patent is extended or adjusted under 35 U.S.C. 154(b) by 0 days.

(21) Appl. No.: 16/529,111

(22) Filed: Aug. 1, 2019

(65) Prior Publication Data

US 2020/0039660 A1 Feb. 6, 2020

(30) Foreign Application Priority Data

Aug. 2, 2018 (GB) ...................................... 1812613

(51) Int. Cl.
| | |
|---|---|
| *F16K 31/02* | (2006.01) |
| *B64D 37/16* | (2006.01) |
| *G01R 29/12* | (2006.01) |
| *B67D 7/32* | (2010.01) |
| *B64F 1/28* | (2006.01) |
| *B64D 39/00* | (2006.01) |

(52) U.S. Cl.
CPC ................ *B64D 37/16* (2013.01); *B64F 1/28* (2013.01); *B67D 7/3236* (2013.01); *G01R 29/12* (2013.01); *B64D 39/00* (2013.01)

(58) Field of Classification Search
CPC ........... B64D 37/16; B64D 39/00; B64F 1/28; B67D 7/3236; G01R 29/12
USPC ..................... 137/2, 487.5; 251/212; 141/94; 340/540, 618; 73/35.16, 35.08, 114.38
See application file for complete search history.

(56) References Cited

U.S. PATENT DOCUMENTS

| | | | | |
|---|---|---|---|---|
| 2,362,559 | A * | 11/1944 | Jauch ........................ | B64F 1/28 222/1 |
| 2,909,190 | A | 10/1959 | Wilson | |
| 3,013,578 | A | 12/1961 | Askevold | |
| 3,141,113 | A * | 7/1964 | Munday ............... | B67D 7/3236 361/215 |
| 3,405,722 | A * | 10/1968 | Carruthers ............. | B65D 90/46 137/2 |
| 3,764,894 | A * | 10/1973 | Dukek ..................... | G01R 5/28 324/453 |
| 4,094,492 | A * | 6/1978 | Beeman ................... | F16K 3/03 138/45 |

(Continued)

FOREIGN PATENT DOCUMENTS

| | | |
|---|---|---|
| CA | 2 838 718 | 12/2012 |
| CN | 202646795 | 1/2013 |

(Continued)

OTHER PUBLICATIONS

Extended European Search Report for European Application No. 19188806.4, eight pages, dated Dec. 20, 2019.

*Primary Examiner* — Minh Q Le

(74) *Attorney, Agent, or Firm* — Nixon & Vanderhye P.C.

(57) ABSTRACT

A refuelling system is disclosed having a fuel conduit, a variable-position valve for controlling a rate of flow of fuel leaving the conduit, and a controller. The controller is configured to receive from a sensor arrangement a measurement of an electrostatic condition in a fuel tank being fuelled by the system. The controller is configured to control the variable-position valve to control the rate of flow of fuel based at least in part on the measurement received from the sensor arrangement.

18 Claims, 5 Drawing Sheets

(56) References Cited

U.S. PATENT DOCUMENTS

| | | | | |
|---|---|---|---|---|
| 4,258,736 | A * | 3/1981 | Denbow | G01N 27/06 |
| | | | | 137/2 |
| 4,439,216 | A * | 3/1984 | Perryman | B03C 3/34 |
| | | | | 323/903 |
| 4,510,441 | A * | 4/1985 | Yasuda | G01R 15/242 |
| | | | | 324/415 |
| 8,381,779 | B1 | 2/2013 | Wyler | |
| 8,434,721 | B2 * | 5/2013 | Glaser | B64F 1/28 |
| | | | | 141/59 |
| 9,108,738 | B1 * | 8/2015 | Tweet | B64D 37/14 |
| 9,340,298 | B1 * | 5/2016 | Dunn, Jr. | B64D 37/16 |
| 2006/0198076 | A1 | 9/2006 | Myers et al. | |
| 2006/0215346 | A1 | 9/2006 | Yang | |
| 2008/0035873 | A1 * | 2/2008 | Wark | F16K 3/03 |
| | | | | 251/212 |
| 2008/0230146 | A1 * | 9/2008 | Kastner | B67D 7/28 |
| | | | | 141/192 |
| 2008/0282806 | A1 * | 11/2008 | Chakraborty | G01L 13/025 |
| | | | | 73/718 |
| 2011/0030839 | A1 * | 2/2011 | Lohmann | B67D 7/3209 |
| | | | | 141/4 |
| 2011/0061740 | A1 * | 3/2011 | Watkins | B64F 1/28 |
| | | | | 137/2 |
| 2012/0024418 | A1 | 2/2012 | French | |
| 2013/0119202 | A1 | 5/2013 | French | |
| 2013/0126676 | A1 * | 5/2013 | Travers | B64D 37/16 |
| | | | | 244/135 A |
| 2014/0124061 | A1 | 5/2014 | Daniels | |
| 2016/0362195 | A1 * | 12/2016 | Wilkinson | B67D 7/04 |
| 2019/0047843 | A1 * | 2/2019 | Tillotson | B67D 7/425 |
| 2019/0114377 | A1 * | 4/2019 | Westin | G06F 30/23 |
| 2019/0198678 | A1 * | 6/2019 | Takechi | H01L 29/78696 |
| 2019/0204373 | A1 * | 7/2019 | Tung | G01R 29/12 |

FOREIGN PATENT DOCUMENTS

| | | |
|---|---|---|
| CN | 104627376 | 5/2015 |
| CN | 104627932 | 5/2015 |
| FR | 2997745 | 5/2014 |
| GB | 942607 | 11/1963 |
| GB | 201012730 | 7/2010 |
| GB | 201012735 | 7/2010 |
| WO | 2011/150967 | 12/2011 |

* cited by examiner

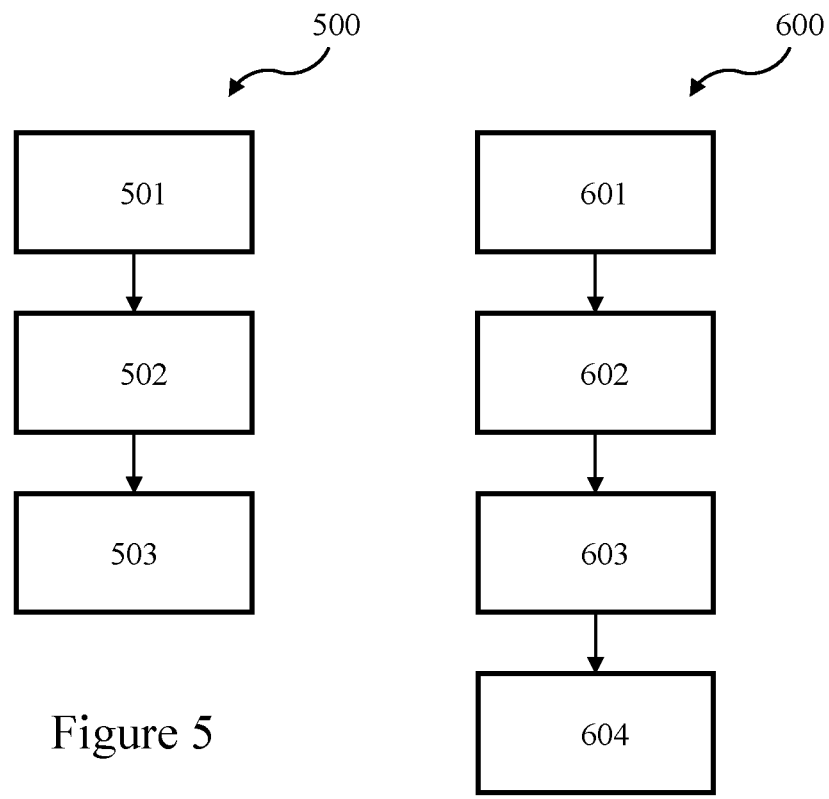
Figure 5
Figure 6
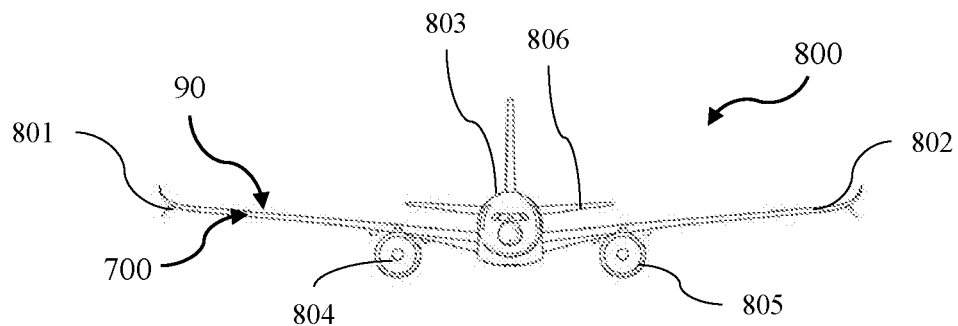
Figure 7

REFUELLING SYSTEM

CROSS RELATED APPLICATION

This application claims priority to United Kingdom (GB) Patent Application No. 1812613.6, filed Aug. 2, 2018, the entire contents of which are hereby incorporated by reference.

TECHNICAL FIELD

The present invention relates to a refuelling system and methods of refuelling a fuel tank.

BACKGROUND

Aircraft may be refuelled between flights with an amount of fuel. It is desirable to maximise the flying time of an aircraft and therefore to minimise the time spent on the ground between flights. The time spent refuelling may contribute to the time required between flights and it is therefore desirable to minimise time spent refuelling an aircraft.

In refuelling an aircraft, a build-up of electrostatic charge can arise which can pose a threat to the safety of the aircraft and persons in the vicinity. The build-up of charge may be due to ionic impurities in the fuel and may be due to a shearing effect in the fuel as the fuel is forced through filters, valves and through changes in flow direction during refuelling. The amount of electrostatic build-up typically increases with the rate of flow of fuel provided to the aircraft. Therefore, in order to mitigate the threat from electrostatic charge build-up, a maximum flow rate for refuelling may be imposed. The flow rate may be controlled by sizing the fuel pipes or the use of an orifice plate having an orifice of a particular size. Similarly, a potentially dangerous build-up of electrostatic charge may arise in refuelling of fuel tanks other than for an aircraft, for example fuel tanks at a refuelling station.

The maximum flow rate may be based on "worst-case scenario" assumptions, and may assume that there are no factors, such as antistatic additives in the fuel, present to mitigate the risk from electrostatic charge build-up. The maximum flow rate may also be set to counter the risk of over-pressurisation of the fuel tank. A risk of over-pressurisation may exist only when a fuel tank is reaching capacity. As such, the imposing of such a maximum flow rate throughout a refuelling operation may dictate a minimum amount of time required to refuel a tank, even when a threat from electrostatic build-up or over-pressurisation is not present. It would be advantageous to be reduce the time required to refuel a fuel tank, such as an aircraft fuel tank, while doing this refuelling safely.

SUMMARY

According to a first aspect of the present invention there is provided a refuelling system, the system comprising: a fuel conduit; a variable-position valve for controlling a rate of flow of fuel leaving the conduit; and a controller; wherein the controller is configured to receive from a sensor arrangement a measurement of an electrostatic condition in a fuel tank being fuelled by the system and the controller is configured to control the variable-position valve to control the rate of flow of fuel based at least in part on the measurement received from the sensor arrangement.

Optionally, the variable-position valve is a shutter valve which defines a variable sized opening arranged for fuel to flow through, and the controller is configured to control the size of the opening defined by the shutter valve to control the rate of flow of fuel.

Optionally, the measurement of the electrostatic condition in the fuel tank is based on an electric field measurement.

Optionally, the measurement of the electrostatic condition in the fuel tank is based on a streaming current measurement.

Optionally, the controller is configured to receive a determination of a level of fuel in the tank, and the controller is configured to control the variable-position valve based on the measurement of the electrostatic condition in the fuel tank and based on the determined level of fuel in the tank.

Optionally, the controller is configured to control the variable-position valve in response to the determined level of fuel in the tank to prevent an over-pressurisation condition in the tank.

Optionally, the refuelling system comprises a second valve located in the conduit to selectively start or stop the flow of fuel through the conduit.

Optionally, the second valve is configured to stop the flow of fuel through the conduit in response to an overflow condition detected in the fuel tank.

Optionally, the variable-position valve is configured to default to a closed position in response to a failure of the refuelling system.

Optionally, the controller is configured to gather data corresponding to refuelling of a tank, wherein the data relates to the measured electrostatic condition of the tank throughout refuelling of the tank and one or more other factors relating to the refuelling of the tank.

Optionally, the one or more other factors relating to the refuelling of the tank comprises one or more of a flow rate profile throughout the refuelling, or a fuel type used, or a property of the tank, or a fuel level in the tank.

According to a second aspect according to the present invention, there is provided a refuelling system for an aircraft, the system being configured to supply fuel to a tank at a variable flow rate, wherein the flow rate is varied by controlling a variable-position valve based on a measurement of the amount of electrostatic charge reaching the tank.

According to a third aspect according to the present invention there is provided a method of refuelling a fuel tank comprising: measuring, with a sensor arrangement, an electrostatic condition associated with the fuel tank; determining, with a controller, a flow rate of fuel to be supplied to the tank based at least on the measured electrostatic condition associated with the fuel tank; and controlling, with the controller, a variable-position valve to supply fuel to the fuel tank at the determined flow rate.

Optionally, the method comprises determining a level of fuel in the tank, and determining the flow rate of fuel to be supplied to the tank is based on the measured electrostatic condition associated with the fuel tank and the determined level of fuel in the tank.

Optionally, determining the flow rate of fuel comprises: determining a level of an electrostatic threat from the measured electrostatic condition, and the determined flow rate of fuel is the maximum flow rate to maintain the level of the electrostatic threat at or below a predetermined level.

Optionally, determining the flow rate of fuel comprises determining a threat of over-pressurising the tank, and the determined flow rate of fuel is the maximum flow rate to maintain the threat of over-pressurising the fuel tank below a predetermined level.

Optionally, the method is a method of refuelling a tank on an aircraft.

According to a fourth aspect of the invention there is provided a vehicle comprising: a refuelling system according to the first aspect or according to the second aspect; and a sensor arrangement configured to measure an electrostatic condition in a fuel tank being fuelled by the system.

Optionally, the sensor arrangement comprises one or more sensors located at the fuel tank.

Optionally, one of the sensors located at the fuel tank is an electric field sensor.

Optionally, the sensor arrangement comprises one or more sensors located at the fuel conduit or at the variable-position valve.

Optionally, one of the sensors located at the fuel conduit or at the variable-position valve is a streaming current sensor.

Optionally, the vehicle is an aircraft.

BRIEF DESCRIPTION OF THE DRAWINGS

Embodiments of the invention will now be described, by way of example only, with reference to the accompanying drawings, in which:

FIG. 5 shows a flow chart illustrating an example of a method of refuelling a fuel tank.

FIG. 6 shows a flow chart illustrating another example of a method of refuelling a fuel tank.

FIG. 7 shows a schematic front view of an aircraft.

DETAILED DESCRIPTION

Figure 1:
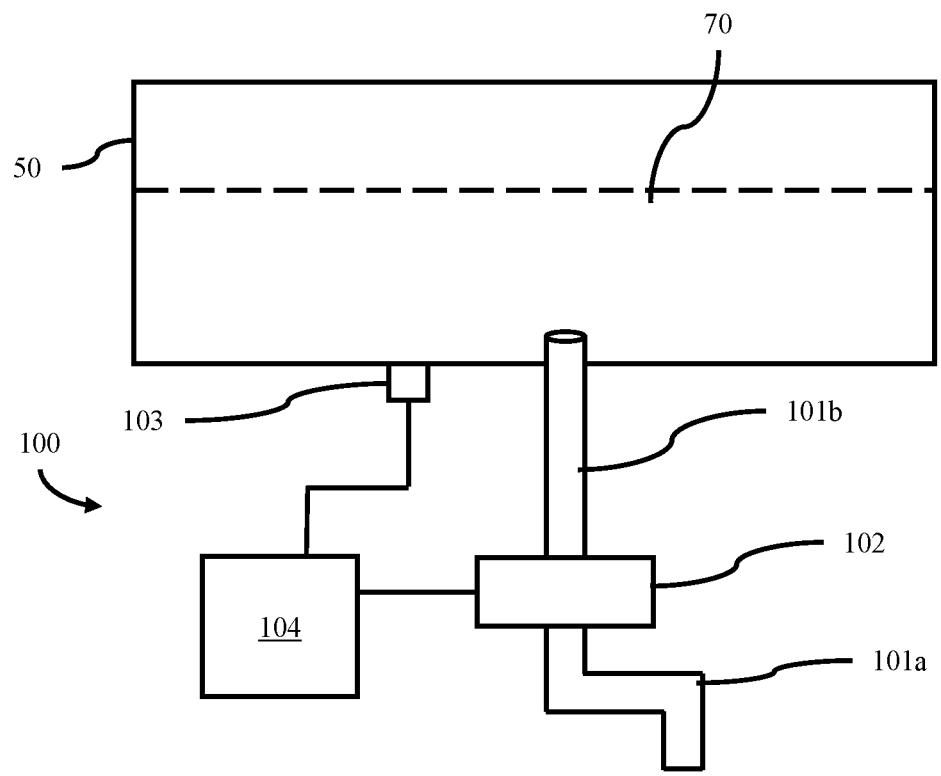
FIG. 1 shows a schematic representation of a refuelling system according to examples described herein.

Some known refuelling systems, such as for an aircraft, comprise a valve, such as a ball valve, for starting and stopping the flow of fuel through a fuel conduit to a fuel tank. A ball valve in such examples provides a binary, stop-start, function, either allowing fuel to flow or stopping the flow of fuel. Such a refuelling system may also comprise a flow restrictor, such as an orifice plate having an orifice of a particular size, in order to limit the flow of fuel to a particular rate. The size of the orifice plate is typically chosen to meet certain safety constraints. For example, the size of the orifice plate may be chosen to limit fuel flow to a rate which prevents over-pressurisation of the fuel tank and limits a build-up of electrostatic charge to a safe level.

An orifice plate may impose a maximum flow rate which may be dictated by "worst-case scenario" assumptions about the amount of electrostatic build-up which occurs for a particular flow rate. For example, the determined maximum flow rate may be based on an assumption that the fuel does not contain anti-static additives, or may be based on certain assumed properties of the fuel tanker filter or bowser filter. In one example, a maximum flow rate for refuelling an aircraft with kerosene fuel corresponds to a maximum flow velocity of around 7 $ms^{-1}$, which may be specified for refuelling of an aircraft on the ground. In examples, higher maximum flow velocities may be specified for aircraft-to-aircraft refuelling. The maximum rate may be significantly lower than the fuel flow rate which is actually safe in a given refuelling situation. For example, the fuel may include antistatic additives or the bowser filter type may be such that the amount of electrostatic build-up is lower than is assumed for a given flow rate. The fuel flow rate may therefore be restricted more than is necessary for safe refuelling by use of an orifice plate, resulting in a greater refuel time than is technically required and therefore there is a potential operational and economic impact to the airliner.

Example refuelling systems described herein may be suitable for refuelling an aircraft. Such systems may be configured to supply fuel to a tank at a variable flow rate, which is varied by control of a variable-position valve based on a measurement of the electrostatic environment within the tank. Examples described herein provide a refuelling system which controls the fuel flow rate to a tank based on the actual electrostatic threat present. This is done by measuring an electrostatic condition associated with the fuel tank being refuelled. Example methods described herein may therefore avoid use of a fixed maximum flow rate based on pessimistic safety assumptions. The measuring of the electrostatic condition of the tank may also reduce or avoid difficulties associated with making an assumption of the level of electrostatic build-up for a given flow rate. In the example of refuelling an aircraft, examples described herein may provide for maintaining a safe rate of fuel flow in the event that changes to fuel standards or airport infrastructure affect the likelihood of a dangerous build-up of electrostatic charge at a given fuel flow rate.

Since in examples described herein, the electrostatic conditions of the fuel tank are being measured during refuelling, in some examples a refuelling system may gather data relating to electrostatic build-up and may correlate this data with factors defining a refuelling operation. An analysis of the gathered data may be performed to improve understanding of how various factors affect the build-up of electrostatic charge during refuelling. For example, electrostatic data measured during refuelling of an aircraft may be correlated with flow rate during refuelling, or geographical location, or the type of bowser or bowser filter used, or the type of fuel used. In an example, trends of electrostatic buildup during a refuelling operation may be correlated with data indicating at which airport the refuelling operation took place.

Some examples described herein provide for the use of a variable-position valve in place of a ball-valve and an orifice plate. This may result in weight or space savings on an aircraft, or an improvement in reliability, or ease of maintenance of the refuelling system.

Referring to FIG. 1, there is shown a schematic representation of a first example of refuelling system 100. The refuelling system 100 is for refuelling a fuel tank 50 with fuel 70. The tank 50 may be a fuel tank of an aircraft. In examples, the refuelling system 100 is located on an aircraft (not shown) and may, for example, receive fuel from a fuel tanker or bowser (not shown). The refuelling system 100 comprises a fuel conduit 101a, 101b for carrying fuel 70 to the tank 50. The refuelling system 100 comprises a variable-position valve 102 for controlling a rate of flow of fuel 70 to the tank, and the conduit comprises a first portion 101a for carrying fuel 70 to the valve 102 and a second portion 101b for carrying fuel 70 from the valve 102 to the tank 50. The tank 50 may comprise means (not shown in FIG. 1) for venting air from the tank as fuel 70 is introduced from the conduit 101b.

The refuelling system 100 is configured to receive from a sensor arrangement a measurement of an electrostatic condition associated with the fuel tank 50. In the example of FIG. 1, the sensor arrangement comprises at least one sensor 103 located on or in the fuel tank 50, which, for example, may be an electric field sensor which measures a magnitude of or a magnitude and direction of the electric field associated with the fuel tank 50. The sensor 103 is connected via a wired or wireless connection to a controller 104 to transmit data to the controller 104. In other examples, the sensor arrangement may comprise a sensor located on the fuel conduit 101a, 101b or at the valve 102, as will be discussed below with reference to other examples. In examples, the sensor arrangement comprises more than one sensor arranged to measure an electrostatic condition of the fuel tank 50, for example comprising one or more sensors located at the fuel tank 50, and/or one or more sensors located at the fuel conduit 101a, 101b or at the valve 102.

The measured electrostatic condition associated with the fuel tank 50 may comprise a measurement of electric field, for example at one or more positions in the tank 50. The measured electrostatic condition associated with the fuel tank 50 may comprise a measurement of a streaming current from fuel flowing in the conduit 101a, 101b. For example, controller 104 may measure a streaming current by measuring a flow of current to ground through a resistor and determine from a measured streaming current an amount of electrostatic charge provided to the tank 50.

The controller 104 is configured to control the variable-position valve 102 to control a rate of flow of fuel 70 to the tank 50. For example, the controller 104 may control the valve 102 to control the rate of flow of fuel 70 by varying the size of an opening of the valve. In an example, the variable-position valve 102 is a shutter valve which defines a variable sized opening arranged for fuel 70 to flow through. In such examples, the controller 104 may then control the shutter valve 102 to increase the size of the opening it defines to increase the rate of flow of fuel 70 to the tank 50. Conversely, the controller 104 may control the shutter valve 102 to decrease the size of the opening it defines to decrease the rate of flow of fuel 70. The controller 104 may thus monitor the measurements of the sensor 103 throughout a refuelling operation and actively control the fuel flow rate by controlling the amount that the variable-position valve 102 is opened.

The controller 104 is configured to control the rate of flow of fuel 70 to the tank 50 based on the electrostatic condition of the tank 50 measured by the sensor arrangement, in this example based on measurements made by sensor 103. For example, the controller 104 may determine the level of an electrostatic threat from the measurements of sensor 103. If the controller 104 determines that there is no significant electrostatic threat present, the controller 104 may, for example, control the valve 102 to supply fuel 70 to the tank 50 at a maximum rate. Where the valve 102 is a shutter valve supplying fuel 70 at a maximum rate involves the controller causing the shutter valve to fully open to provide a maximally-sized opening. If the controller 104 determines from the measurements of sensor 103 that an electrostatic threat is present, or that the level of an electrostatic threat is above a predetermined level, the controller 104 may control the valve 102 to reduce the rate of flow of fuel 70 to the tank 50. As such, the refuelling system 100 is able to respond to a measured electrostatic condition of the tank 50 to control the rate of flow of fuel 70. In some examples, this may provide for decreased time required to refuel the tank 50 since the rate of flow of fuel is restricted in response to the presence of a determined threat and not restricted where no threat is present.

The controller 104 may control the valve 102 based on measurements provided to the controller 104 by the sensor arrangement according to any suitable method. For example, the controller 104 may receive data from the sensor 103 representing electrostatic measurements associated with the tank 50 and from that data determine an optimal fuel flow rate. For example, the controller 104 may receive from the sensor 103 data indicating the magnitude of the electric field in the tank 50 and may determine an optimal flow rate based on the magnitude of the electric field, fuel volume, tank geometry etc. In some examples, the sensor arrangement may comprise a streaming current sensor measuring a streaming current of the fuel 70 in the conduit 101a, 101b. In such examples, a streaming current sensor may be placed at any location on the conduit 101a, 101b. The controller 104 may receive data from the streaming current sensor and use this data to determine a level of an electrostatic threat. In other examples, the controller may receive from the sensor arrangement streaming current measurements and electric field measurements and may use these measurements to determine a level of an electrostatic threat, for example by determining a total amount of electrostatic charge added to the tank 50 by the refuelling operation. The controller 104 may determine an optimal flow rate to minimise the refuelling time while keeping a determined electrostatic threat below a predetermined level.

Figure 2:
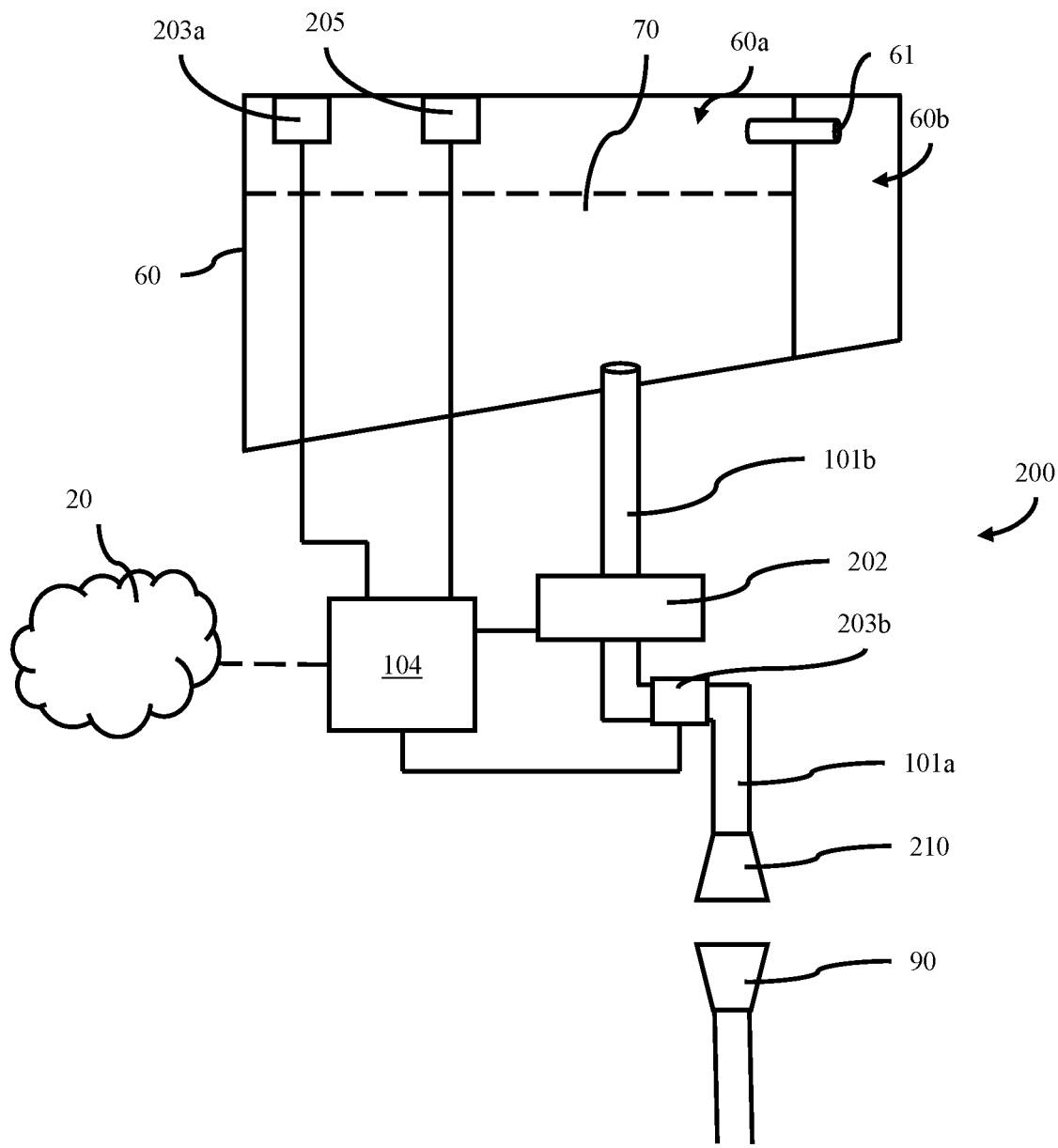
FIG. 2 shows a schematic representation of another refuelling system according to examples described herein.

FIG. 2 shows a schematic representation of a second example of a refuelling system 200, in this example, refuelling system 200 is for an aircraft. Some of the features of the refuelling system 200 are the same as features of the refuelling system 100 shown in FIG. 1 and those features have the same reference numerals as they do in FIG. 1.

In the example shown in FIG. 2, the tank 60 may be a wing fuel tank of an aircraft. In other examples, the tank 60 may be located at any suitable location in the aircraft and may be any suitable type of fuel tank. For example, the tank may be a centre tank, a rear centre tank, an additional centre tank (ACT), a trim tank, or any other type of tank. In the example of FIG. 2, the controller 104 of the refuelling system 200 receives measurements of an electrostatic condition of the fuel tank 60 being refuelled from a sensor arrangement comprising a first sensor 203a and a second sensor 203b. The first sensor 203a is an electric field sensor for measuring the magnitude or the direction of an electric field in the tank 60. The second sensor 203b is a streaming current sensor for measuring a streaming current from the fuel passing through the conduit 201a, 201b. The controller 104 may receive measurement data from the sensors 203a, 203b and any other sensors present via a wired or wireless connection.

In the example represented in FIG. 2, the tank 60 comprises a first section 60a, and a second section 60b connected by a vent 61. The first section 60a is for containing fuel 70, and the second section 60b is to receive air vented from the first section 60a via the vent 61 when fuel 70 is introduced to the first section 60a. The conduit 101a in FIG. 2 comprises a connector 210, for example a solenoid connector, for coupling to a fuel supply conduit 90. In examples, the solenoid connector is configured to open and shut to start and stop the flow of fuel into the refuelling system 200. The fuel supply conduit 90 may supply fuel from a fuel reservoir in a tanker or a bowser (not shown) which may comprise suitable filters and pumping mechanisms to supply the fuel to the refuelling system 200.

In the example represented in FIG. 2, in addition to receiving measurements from the sensor arrangement comprising sensors 203a, 203b, for measuring an electrostatic condition of the tank 60, the controller 104 receives data from a sensor 205 indicating a level of fuel 70 in the tank 60. The controller 104 controls the rate of flow of fuel 70 via controlling the valve 202 based on the data received by the sensors 203a, 203b and sensor 205. The controller 104 may, for example, control the valve 202 to prevent over-pressurisation in the tank 60 due to the addition of fuel 70. The controller 104 may, for example, reduce the rate of flow of fuel 70 to the tank 60 as the level of fuel 70 in the tank 60 is approaching a maximum allowable level in order to prevent over-pressurisation of the tank 60. In one example, the controller 104 is configured to restrict the rate of flow of fuel to a predetermined rate when the level sensor 205 indicates that the level of fuel 70 in the tank 60 reaches a predetermined level. For example, the controller 104 may be configured to restrict the rate of flow of fuel 70 to a predetermined rate when the level sensor 205 indicates to the controller 104 that the level of fuel 70 in the tank 60 is approaching a specified level. For example, in a given refuelling operation the tank may be refuelled to a specified level which is less than the maximum allowable level for the tank, or the specified level may be the maximum allowable level for the tank. In an example, the controller 104 may be configured to restrict the fuel flow rate when the level reaches 90% of the specific value. The predetermined rate may be a maximum allowable safe rate, as determined according to criteria for preventing over-pressurisation. Decreasing the flow rate may increase the accuracy of the refuelling operation. For example, the fuel 70 may be kerosene and the predetermined rate may correspond to a flow velocity of between 5 and 10 ms$^{-1}$, for example around 7 ms$^{-1}$.

In some examples, the controller 104 may receive further data, such as an indication of the fuel mass in the tank 60, and use this data in conjunction with measurements of an electrostatic condition of the tank 60 to control the rate of fuel flow. The controller 104 may use a suitable algorithm to determine an optimal flow rate based on data received from the sensors 203a, 203b and any other sensors present.

In the example shown in FIG. 2, the controller 104 supplies data to a data lake 20. Data transmitted to the data lake 20 may then be stored and/or analysed. For example, the controller 104 may supply data relating to the measurements of the electrostatic condition of the fuel tank 60 made by the sensors 203a, 203b, to the data lake 20. The controller 104 may also transmit data indicating the rate of flow of fuel 70 throughout a refuelling session, and data identifying any one or more of the type of aircraft being refuelled, or the type of fuel being used, or the temperature or pressure of the refuelling environment, or the location at which the refuelling is taking place. An analysis of such data may allow trends relating to the build-up of electrostatic charge in various environments and circumstances to be ascertained.

Figure 3A:
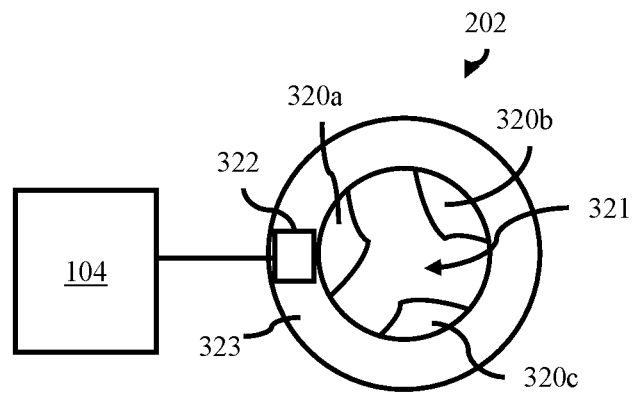
FIGS. 3a-3c show schematic axial views of an example of the variable-position valve and controller of example refuelling systems described herein.
Figure 3B:
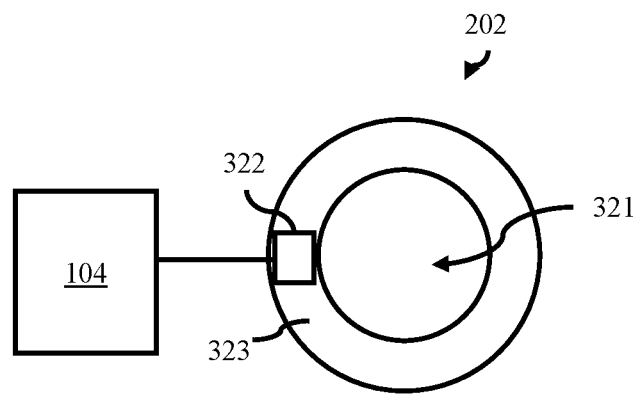
Figure 3C:
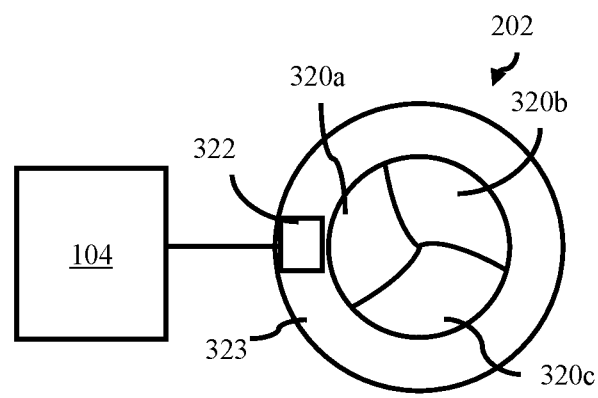

FIGS. 3a, 3b, and 3c show a schematic axial representation of an example of the variable-position valve 202 that can be used in the refuelling systems of FIG. 2 and may be used as valve 102 in the example of FIG. 1. In this example, the variable-position valve 202 is a shutter valve. In use, the shutter valve 202 is connected between first and second portions of the fuel conduit of the refuelling system. The shutter valve 202 is connected to the controller 104 to be controlled by the controller 104 in response to data received from a sensor arrangement (not shown in FIG. 3a, 3b, or 3c) as described with reference to FIG. 2 or FIG. 1. The shutter valve 202 comprises a drive unit 322 and movable shutter plates 320a, 320b, 320c which are retractable into a housing 323 of the shutter valve 202. In the example of FIGS. 3a-c the shutter valve 202 comprises three shutter plates, it will be appreciated that in other examples a shutter valve to be used in a refuelling system described herein may comprise any suitable number of shutter plates. The position of the shutter plates 320a, 320b, 320c defines the size of an opening 321 through which in use fuel flows. The drive unit 322 is controlled by the controller 104 to position the shutter plates 320a-c, to configure the opening 321 to a particular size. The size of the opening 321 is adjustable to adjust the rate of flow of fuel through the opening 321 and thus to adjust the rate of flow of fuel to a tank being fuelled. The controller 104 may supply power to the drive unit 322, or in some examples, the drive unit 322 may be powered separately to the controller 104. In some examples, the drive unit 322 and the controller 104 may be in a wired connection, or in some examples the drive unit 322 may comprise a receiver (not shown) and the controller 104 may comprise a transmitter (not shown), and the drive unit 322 may be controlled by the controller 104 via wireless communication between the transmitter and the receiver.

FIG. 3a shows the shutter valve 202 in a first configuration wherein the shutter plates 320a, 320b, 320b are not fully retracted into the housing 323 but in which an opening 321 is defined. The first configuration shown in FIG. 3a is thus a configuration to provide a flow rate which is non-zero but which is not the maximum flow rate providable by the shutter valve 202.

FIG. 3b shows the shutter valve 202 in a second configuration in which the shutter plates 320a-c are fully retracted into the housing 323 and the opening 321 is at its maximum size. The second configuration shown in FIG. 3b is thus a configuration to provide a maximum flow rate providable by the shutter valve 202.

FIG. 3c shows the shutter valve 202 in a third configuration in which the shutter plates 320a-c are fully extended from the housing 323 such that there is no opening for fuel to flow through. The third configuration thus shows the shutter valve 202 in its closed configuration in which no fuel is allowed to flow.

In some examples, a variable-position valve used in refuelling systems described herein may be configured to default to a predetermined position in response to a failure of the refuelling system, for example a failure of the controller, or the variable-position valve, or a failure of the sensor arrangement. In an example where the variable-position valve is a shutter valve, shutter plates 320a-c of shutter valve 202 may be configured to move to a predetermined position in response to a failure of the refuelling system. Examples of the shutter valve 202 failing may include a loss of power to drive unit 322, a detected condition in which the drive unit 322 is unable to move the shutter plates 320a-c, or a loss of communication with the controller 104. The shutter plates 320a-c may be biased to automatically move to the predetermined position when a failure is detected. The predetermined position of the shutter plates 320a-c may be to define a closed configuration, such as that shown in FIG. 3c, such that the flow of fuel is stopped in response to a failure of the refuelling system.

Figure 4:
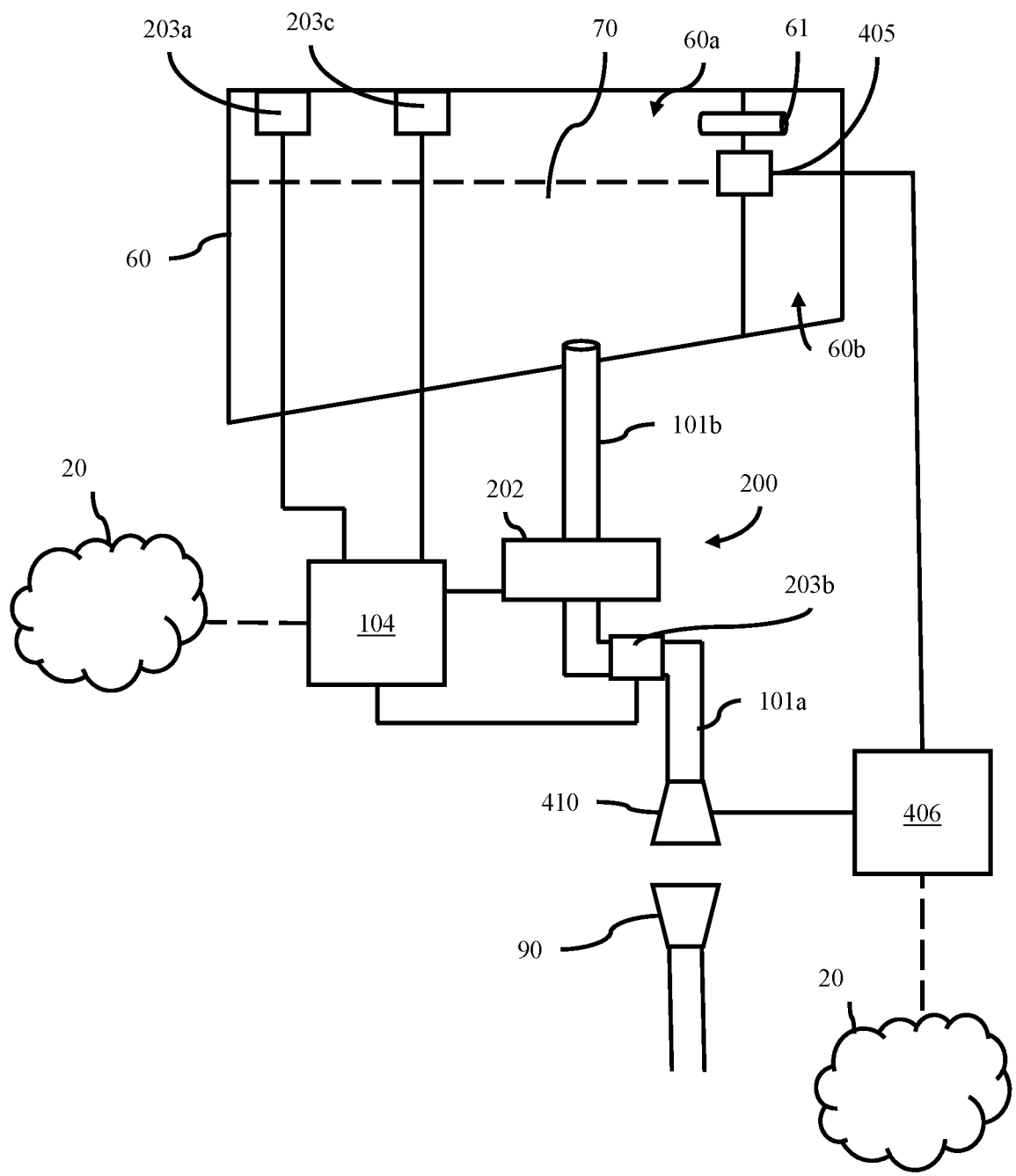
FIG. 4 shows a schematic representation of an example refuelling system according to examples described herein.

FIG. 4 shows another example of refuelling system 400, in this example, the refuelling system 400 is again for an aircraft. Some of the features of the refuelling system 400 are the same as features of the refuelling system 200 shown in FIG. 2 and those features have the same reference numerals as they do in FIG. 2.

The refuelling system 400 of FIG. 4 comprises a connector 410 which acts as a second valve. For example, the connector may comprise a solenoid valve for connecting the refuelling system 400 to the fuel supply apparatus 90. In this example, controller 104 is a first controller and the second valve 410 is connected to a second controller 406. The refuelling system 400 also receives data from an overflow sensor 405, in this example located at the wall between the first section 60a of the tank and the second section 60b of the tank. The second valve 410 allows the flow of fuel 70 through the conduit 101a to be selectively started or stopped. The second valve 410 may stop the flow of fuel 70 to the tank 60 in the event that the overflow sensor 405 detects an overflow condition in the tank 60. For example, the second valve 410 may be shut in response to an overflow condition which occurs due to a failure of the variable-position valve 202, or control of said valve 202. In the example of FIG. 4 the second valve 410 is controlled by the second controller 406. The second valve 410 may additionally or alternatively be manually controllable by a user. In another example, the refuelling system may not comprise second controller 406 and the second valve may be controlled by first controller 104. However, providing a second controller 406 or otherwise allowing control of second valve 410 independently of the variable position valve 202 may be advantageous to minimise the likelihood of both the variable-position valve 202 and the second valve 410 failing in response to the same event, for example a failure of the controller 104. In examples, as mentioned above, the second valve 410 is a solenoid valve, which is controlled in response to the overflow sensor 405 and controlled independently of the variable position valve 202. In the example of FIG. 4, the second controller 406 is connected to data lake 20 and may supply data originating from the overflow sensor 405 or second valve 410 to the data lake 20.

As described above, in some examples the variable-position valve 202 is configured to default to a predetermined configuration if the refuelling system 400 fails. In some examples, the predetermined configuration may be one in which the valve 202 is closed and the flow of fuel is stopped. In another example, the predetermined configuration may be one which allows a predetermined flow rate of fuel, which may be a non-zero flow rate. For example, where the fuel is kerosene, the valve 202 may be configured to default to provide a flow rate corresponding to a flow velocity of between 5 and 10 ms$^{-1}$, for example around 7 ms$^{-1}$. As such, the variable-position valve may provide an equivalent flow restricting function to a fixed size orifice plate when a failure in the refuelling system 400 occurs. A safe maximum flow rate thus may be ensured even when a failure of the refuelling system 400 occurs. The valve 202 may be a shutter valve such as shutter vale 202 described in FIGS. 3a-c and may default to a configuration such as that shown in FIG. 3a. In examples, the second valve 410 may then be used to selectively start or stop the flow of fuel 70.

FIG. 5 shows a representation of an example method 500 of refuelling a fuel tank, for example refuelling a fuel tank with an example refuelling system as described above. The method 500 comprises, at block 501, measuring, with a sensor arrangement, an electrostatic condition associated with the fuel tank. Measuring an electrostatic condition associated with the fuel tank may be done via use of a sensor arrangement as described above in relation to example refuelling systems. At block 502, the method 500 comprises determining, with a controller, a flow rate of fuel to be supplied to the tank based at least on the measured electrostatic condition associated with the fuel tank. At block, 503, the method 500 comprises controlling, with the controller, a variable-position valve to supply fuel to the fuel tank at the determined flow rate.

FIG. 6 shows a representation of another example method 600 of refuelling a fuel tank. The method comprises, at block 601, measuring an electrostatic condition associated with the fuel tank. The method may comprise, at block 601, any of the features described for block 501 with reference to FIG. 5 and with reference to example refuelling systems described above.

The method 600 comprises, at block 602, determining a level of fuel in the fuel tank. For example, the controller may receive data indicating a level of fuel in the tank. The data indicating a level of fuel in the tank may be obtained via a level sensor at the tank, or may be obtained by other suitable means, such as a calculation involving the amount of fuel in the tank at the start of the refuelling process, and a measure of the amount of fuel supplied to the tank.

The method 600 comprises, at block 603, determining, with the controller, a flow rate of fuel to be supplied to the tank. The flow rate of fuel to be supplied to the tank may be determined by any suitable method. In this example, determining the flow rate of fuel to be supplied to the tank is done by the controller based on the measured electrostatic condition associated with the tank and based on the determined level of fuel in the tank. In some examples, the measured electrostatic condition associated with the tank may be used to determine an electrostatic threat present. For example, a magnitude of the electric field measured in the fuel tank may be correlated by the controller with a level of electrostatic threat. A threshold maximum allowable electrostatic threat level may be defined which may correspond with the measured electrostatic condition. For example, the maximum allowable electrostatic threat level may correspond with a maximum allowable electric field magnitude. In other examples, the measured electrostatic condition may be a cumulative measure of electrostatic charge discharged to the fuel tank, for example as measured by a streaming current sensor. A fuel flow rate which maintains the electrostatic threat at or below a predetermined level may then be determined by the controller. Determining the fuel flow rate may take into account a rate of change of quantities measured during the refuelling process. For example, the controller may determine that if refuelling continues at a particular rate the electrostatic threat will exceed the maximum allowable level before refuelling is complete. The controller may then adjust the refuelling rate to prevent the electrostatic threat exceeding the maximum allowable level.

Determining the rate of fuel to be supplied to the tank, at block 603, also comprises taking into account a threat of over-pressurisation of the tank. Over-pressurisation presents a potential threat as the tank reaches capacity, and potentially reaches an overflow condition, and so the controller may take into account the level of fuel in the tank and reduce the rate of fuel flow as the level of fuel in the tank reaches a predetermined level. As such, in the example method 600, the rate of flow of fuel to the tank may be controlled in response to both the measured electrostatic condition of the tank and the determined level of fuel in the tank. The rate of flow of fuel may be determined to minimise the refuelling time while keeping the electrostatic threat below a predetermined level and keeping the threat of over-pressurisation below a predetermined level.

The method 600 at block 604 comprises controlling, with the controller, a variable-position valve to supply fuel to the fuel tank at the determined flow rate. The controller therefore controls the variable-position valve to supply fuel to the tank at the flow rate determined at block 603. As described above, the valve may be a shutter valve and the controller may control the size of the opening defined by the shutter valve to control the rate of flow of fuel. The electrostatic condition of the tank is measured and the level of fuel in the tank is determined throughout the refuelling method. As such, the controller may determine a fuel flow rate to be supplied at each point in the refuelling process and adjust the flow rate accordingly by controlling the variable-position valve.

FIG. 7 shows a representation of an example aircraft 800 viewed from the front. The aircraft 800 comprises a first wing 801, a second wing 802, a fuselage 803, a first engine 804, a second engine 805, and a horizontal tail plane (HTP) 806. In this example, the aircraft 800 comprises a wing fuel tank 90 and a refuelling system 700 mounted in the first wing 801. The refuelling system 700 may have any of the features of example refuelling systems, including any features of example variable-position valves, described herein. The refuelling system 700 is for receiving fuel from a bowser or fuel tanker (not shown) for refuelling the fuel tank 90 of the aircraft 800. In some examples, the aircraft 800 may comprise more than one refuelling systems 700. For example, the aircraft 800 may comprise a second refuelling system, or more than one further refuelling system, configured to supply a one or more further fuel tanks. Such fuel tanks may be located elsewhere in the aircraft 800, such as in the fuselage 803, or HTP, or a further wing 802.

While examples described have described aircraft refuelling systems, it will be appreciated that refuelling systems and methods described herein may also be applicable in other environments where the build-up of electrostatic charge may be a safety concern. For example, systems and methods described herein may be applicable to refuelling other vehicles, such as watercraft, or land vehicles, or may be applicable to refuelling of a fuel reservoir such as found in a refuelling station. In one example, a refuelling system such as described herein may be for refuelling an underground fuel tank on a fuelling court.

It is to be noted that the term "or" as used herein is to be interpreted to mean "and/or", unless expressly stated otherwise.

The above described examples are to be understood as illustrative examples only. Any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the invention, which is defined in the accompanying claims.

The invention claimed is:

1. An aircraft refueling system configured to be located, in use, on an aircraft to refuel a fuel tank of the aircraft, the system comprising:
   a fuel conduit;
   a variable-position valve for controlling a rate of flow of fuel leaving the conduit; and
   a controller;
   wherein the controller is configured to receive from a sensor arrangement a measurement of an electrostatic condition indicative of a level of an electrostatic threat present in the aircraft fuel tank being fuelled by the system and the controller is configured to control the variable-position valve to control the rate of flow of fuel, based at least in part on the measurement of the electrostatic condition, to maintain the electrostatic threat level at or below a predetermined level;
   wherein the controller is configured to gather data corresponding to a refuelling of the aircraft fuel tank, wherein the data comprise first data indicative of the measurement of the electrostatic condition of the aircraft fuel tank throughout the refuelling of the aircraft fuel tank and corresponding second data indicative of one or more other factors relating to the refuelling of the aircraft fuel tank, thereby to allow the first data and the second data to be analyzed to determine a relationship between the first data and the second data; and,
   a second valve configured to allow the flow of fuel through the conduit to be selectively started or stopped.

2. The aircraft refuelling system of claim 1 wherein the variable-position valve is a shutter valve which defines a variable sized opening arranged for fuel to flow through, and wherein the controller is configured to control the size of the opening defined by the shutter valve to control the rate of flow of fuel.

3. The aircraft refuelling system of claim 1, wherein the measurement of the electrostatic condition in the aircraft fuel tank is based on an electric field measurement.

4. The aircraft refuelling system of claim 1, wherein the measurement of the electrostatic condition in the aircraft fuel tank is based on a streaming current measurement.

5. The aircraft refuelling system of claim 1 wherein the controller is configured to receive a determination of a level of fuel in the aircraft tank, and wherein the controller is configured to control the variable-position valve based on the measurement of the electrostatic condition in the aircraft fuel tank and based on the determined level of fuel in the aircraft fuel tank.

6. The aircraft refuelling system of claim 5 wherein the controller is configured to control the variable-position valve in response to the determined level of fuel in the tank to prevent an over-pressurisation condition in the aircraft fuel tank.

7. The aircraft refuelling system of claim 1 wherein the second valve is configured to stop the flow of fuel through the conduit in response to an overflow condition detected in the aircraft fuel tank.

8. The aircraft refuelling system of claim 1 wherein the variable-position valve is configured to default to a closed position in response to a failure of the refuelling system.

9. The aircraft refuelling system of claim 1, wherein the second valve is a solenoid valve.

10. The aircraft refuelling system of claim 1, further comprising a second controller, and wherein the second valve is connected to and controlled by the second controller independently of the variable-position valve.

11. The aircraft refuelling system of claim 1, wherein the second valve is manually controlled by a user.

12. A method of refuelling a fuel tank on an aircraft, the method comprising:
   measuring, with a sensor arrangement on the aircraft, an electrostatic condition indicative of a level of an electrostatic threat associated with the aircraft fuel tank;
   determining, with a controller on the aircraft, based at least in part on the measured electrostatic condition, a flow rate of fuel to be supplied to the aircraft fuel tank to maintain the electrostatic threat level at or below a predetermined level; and
   controlling, with the controller, a variable-position valve on the aircraft to supply fuel to the aircraft fuel tank at the determined flow rate;
   gathering data corresponding to refuelling of the aircraft fuel tank with the controller, wherein the data comprise first data indicative of the measurement of the electrostatic condition associated with the aircraft fuel tank throughout the refuelling of the aircraft fuel tank and corresponding second data indicative of one or more other factors relating to the refuelling of the aircraft fuel tank, thereby to allow the first data and the second data to be analyzed to determine a relationship between the first data and the second data; and, providing a second valve for selectively starting and stopping the flow of fuel through a fuel conduit.

13. The method according to claim 12 comprising determining a level of fuel in the aircraft fuel tank, and wherein determining the flow rate of fuel to be supplied to the aircraft fuel tank is based on the measured electrostatic condition associated with the aircraft fuel tank and the determined level of fuel in the aircraft fuel tank.

14. The method according to claim 12 wherein the determined flow rate of fuel is the maximum flow rate to maintain the level of the electrostatic threat at or below a predetermined level.

15. The method according to claim 14 wherein determining the flow rate of fuel comprises determining a threat of over-pressurising the aircraft fuel tank, and wherein the determined flow rate of fuel is the maximum flow rate to maintain the threat of over-pressurising the aircraft fuel tank below a predetermined level.

16. The method according to claim 12, wherein the second valve is a solenoid valve.

17. The method according to claim 12, further comprising a second controller, and connecting to and controlling the second valve by the second controller independently of the variable-position valve.

18. The method according to claim 12, further comprising manually controlling the second valve by a user.

* * * * *